(12) United States Patent
Reimann

(10) Patent No.: US 10,107,851 B2
(45) Date of Patent: Oct. 23, 2018

(54) ARRANGEMENT AND METHOD FOR DETECTING CONNECTION LOSS AT A CIRCUIT PART HAVING A CAPACITIVE BEHAVIOUR

(75) Inventor: Mathias Reimann, Stuttgart-Sued (DE)

(73) Assignee: Robert Bosch GmbH, Stuttgart (DE)

( * ) Notice: Subject to any disclaimer, the term of this patent is extended or adjusted under 35 U.S.C. 154(b) by 685 days.

(21) Appl. No.: 14/000,121

(22) PCT Filed: Dec. 22, 2011

(86) PCT No.: PCT/EP2011/073821
§ 371 (c)(1),
(2), (4) Date: Oct. 28, 2013

(87) PCT Pub. No.: WO2012/110152
PCT Pub. Date: Aug. 23, 2012

(65) Prior Publication Data
US 2014/0043041 A1    Feb. 13, 2014

(30) Foreign Application Priority Data

Feb. 17, 2011    (DE) .................. 10 2011 004 288

(51) Int. Cl.
*G01R 31/04*   (2006.01)
*G01R 31/02*   (2006.01)

(52) U.S. Cl.
CPC ......... *G01R 31/041* (2013.01); *G01R 31/026* (2013.01)

(58) Field of Classification Search
CPC .... G01R 31/02; G01R 31/021; G01R 31/024; G01R 31/026; G01R 31/028;
(Continued)

(56) References Cited

U.S. PATENT DOCUMENTS 3,982,158 A * 9/1976 Knauer ................. H02H 3/025
361/5
4,370,609 A * 1/1983 Wilson ................. G01R 31/021
324/522
(Continued)

FOREIGN PATENT DOCUMENTS

DE   40 05 609 A1   8/1991
DE   199 38 060 A1   3/2001
(Continued)

OTHER PUBLICATIONS

International Search Report corresponding to PCT Application No. PCT/EP2011/073821, dated Mar. 16, 2012 (German and English language document) (7 pages).

*Primary Examiner* — Huy Q Phan
*Assistant Examiner* — David Frederiksen
(74) *Attorney, Agent, or Firm* — Maginot, Moore & Beck LLP

(57) ABSTRACT

The disclosure relates to an arrangement for detecting connection loss at a circuit part which has a capacitive behavior and is electrically connected to a useful signal source. The disclosure provides an evaluation circuit which is electrically connected to an input node of the circuit part having a capacitive behavior and detects the pulsed useful signal (UNUTZ), output by the useful signal source, at the input node of the circuit part having a capacitive behavior and evaluates the signal characteristics in order to detect connection loss.

8 Claims, 2 Drawing Sheets

(58) Field of Classification Search
CPC .. G01R 31/041; G01R 31/08; G01R 31/2851; G01R 31/2853
See application file for complete search history.

(56) References Cited

U.S. PATENT DOCUMENTS

| | | | |
|---|---|---|---|
| 4,638,246 A | 1/1987 | Blank et al. | |
| 5,087,884 A * | 2/1992 | Brannon | G01R 31/026 324/212 |
| 5,206,595 A * | 4/1993 | Wiggins | G01R 31/08 324/532 |
| 5,477,152 A * | 12/1995 | Hayhurst | G01R 31/024 324/133 |
| 5,530,365 A * | 6/1996 | Lefeldt | G01R 31/11 324/512 |
| 5,650,728 A * | 7/1997 | Rhein | G01R 31/021 324/534 |
| 5,999,002 A * | 12/1999 | Fasnacht | G01R 31/04 324/419 |
| 6,130,530 A * | 10/2000 | McNulty | G01R 15/12 324/546 |
| 2004/0174173 A1 * | 9/2004 | Elms | G01R 31/024 324/509 |
| 2007/0058311 A1 * | 3/2007 | Raiser | H02H 9/041 361/93.1 |
| 2007/0116997 A1 * | 5/2007 | Raiser | H01M 8/04537 429/431 |
| 2007/0132525 A1 * | 6/2007 | Pineda de Gyvez | G01R 31/2824 331/185 |
| 2007/0176604 A1 * | 8/2007 | Morimoto | B60L 3/0023 324/525 |
| 2008/0157782 A1 | 7/2008 | Krah | |
| 2008/0204045 A1 * | 8/2008 | Mielke | G01R 31/3004 324/649 |
| 2011/0316549 A1 * | 12/2011 | Coenen | G01R 31/026 324/434 |
| 2012/0162839 A1 * | 6/2012 | Wiederhold | G01R 31/028 361/65 |

FOREIGN PATENT DOCUMENTS

DE    10 2004 026 971 A1    12/2005
EP            2 239 589 A1    10/2010

* cited by examiner

ARRANGEMENT AND METHOD FOR DETECTING CONNECTION LOSS AT A CIRCUIT PART HAVING A CAPACITIVE BEHAVIOUR

This application is a 35 U.S.C. § 371 National Stage Application of PCT/EP2011/073821, filed on Dec. 22, 2011, which claims the benefit of priority to Serial No. DE 10 2011 004 288.1, filed on Feb. 17, 2011 in Germany, the disclosures of which are incorporated herein by reference in their entirety.

BACKGROUND

The disclosure relates to an arrangement for detecting connection loss at a circuit part having a capacitive behavior and to a method for detecting connection loss at a circuit part having a capacitive behavior.

Safety-critical wire bonds with a monitoring system are provided in known rotation rate sensors for motor vehicles. The principle according to which said system functions is based on a current source that supplies a small measuring DC current to the bond, which current then flows back by way of another bond. It is not possible to maintain the current flow where one of the two bonds is disconnected or interrupted and a disconnection and/or interruption of this type can be recognized in that, for example, an error flag is set that signals a disconnected and/or interrupted bond. However, the described procedure of detecting a bond connection loss cannot be used to monitor bonds that are connected to a circuit part having a capacitive behavior owing to the fact that it is not possible to supply a DC measuring current. Therefore, some safety-relevant bonds cannot be monitored.

The unexamined German application DE 10 2004 026 971A1 describes for example a micromechanical sensor with error recognition. The described sensor comprises a micromechanical functioning part and an electronic evaluating circuit that are mutually electrically connected. In addition, means for performing a self-diagnostic test on the sensor are provided in such a manner that error recognition of at least one electrical connection is achieved. During the self-diagnostic test, an excitation module transmits a signal pattern to the micromechanical functioning part. A measuring signal is then produced that is converted by a signal evaluating module into a sensor output signal. In addition to the test signal, the excitation module provides also a correlation signal. The correlation signal and the sensor output signal are conveyed to a demodulation module in which a correlated demodulation of the signals takes place. A demodulated output signal is conveyed to an evaluating module in which on the basis of the evaluated signal pattern the condition of the at least one electrical connection is finally evaluated and a corresponding signal is output.

SUMMARY

The arrangement in accordance with the disclosure for detecting connection loss at a circuit part having a capacitive behavior and the method in accordance with the disclosure for detecting connection loss at a circuit part having a capacitive behavior have in contrast the advantage that a pulsed useful signal that is already available at the circuit part having a capacitive behavior is sensed and evaluated for the purpose of detecting connection loss. As a consequence, it is possible in an advantageous manner with a small expenditure on hardware and without having to provide additional signal generators for generating test signals to implement a procedure for detecting connection loss in a rapid and reliable manner and as a consequence to provide a solution to achieve a safe and reliable operation in a simple manner.

Embodiments of the present disclosure exploit in an advantageous manner the situation that electrical connection sites to circuit parts having a capacitive behavior follow a periodic pattern of charging and discharging. The appearance of the discharge curves changes in the case of a disconnected electrical connection. This change can be recognized and evaluated whilst monitoring the input junctions to circuit parts having a capacitive behavior.

Embodiments of the present disclosure provide an arrangement for detecting connection loss at a circuit part having a capacitive behavior, which circuit part is electrically connected to a useful signal source. In accordance with the disclosure, an evaluating circuit is provided that is electrically connected to an input junction of the circuit part having a capacitive behavior and said evaluating circuit senses the pulsed useful signal that is output by the useful signal source at the input junction of the circuit part having a capacitive behavior and evaluates the signal characteristic for the purpose of detecting connection loss.

In addition, embodiments of the present disclosure provide a method for detecting connection loss at a circuit part having a capacitive behavior, which circuit part is electrically connected to a useful signal source. In accordance with the disclosure, the pulsed useful signal that is output by the useful signal source is sensed at an input junction of the circuit part having a capacitive behavior and the signal characteristic is evaluated for the purpose of detecting connection loss.

The features and further developments disclosed in the dependent claims provide advantageous improvements to the arrangement disclosed herein for detecting connection loss at a circuit part having a capacitive behavior and to the method disclosed herein for detecting connection loss at a circuit part having a capacitive behavior.

It is particularly advantageous that the evaluating circuit evaluates as a signal characteristic a discharge curve of the pulsed useful signal. The evaluation can for example be performed by virtue of the fact that a currently sensed voltage value of the pulsed useful signal is compared with a threshold value.

In an advantageous embodiment of the arrangement in accordance with the disclosure, the evaluating circuit recognizes for example a disconnected electrical connection and/or a disconnected wire bond if a sensed voltage value of the pulsed useful signal at a measuring point in time exceeds a predetermined threshold value. As an alternative thereto, the evaluating circuit can recognize an intact electrical connection and/or a connected wire bond if the sensed voltage value of the pulsed useful signal at a measuring point in time ($T_m$) is below the predetermined threshold value.

In a further advantageous embodiment of the arrangement in accordance with the disclosure the evaluating circuit selects the measuring point in time so that approx. 80 to 95%, preferably 90%, of a pulse duration of a corresponding evaluating pulse of the useful signal has elapsed, by reason of the fact that at this point in time the corresponding charging or discharging procedure of the capacitive portion of the circuit part is substantially completed. Furthermore, it is proposed that the evaluating circuit senses and/or evaluates the pulsed useful signal continuously, at predeterminable points in time and/or in a periodic manner. These features render it possible to tailor the evaluating point in time in an optimum manner to suit the capacitive behavior of the circuit part that is to be monitored and in an advantageous manner to reliably detect connection loss.

In an advantageous embodiment of the method in accordance with the disclosure, a discharge curve of the pulsed useful signal is evaluated as a signal characteristic, wherein a disconnected electrical connection is recognized if a sensed voltage value of the pulsed useful signal at a measuring point in time exceeds a predetermined threshold value and wherein an intact electrical connection is recognized if the sensed voltage value of the pulsed useful signal at a measuring point in time is below the predetermined threshold value. The measuring point in time is selected such that approx. 80 to 95%, preferably 90% of a pulse duration of a corresponding evaluating pulse of the useful signal has elapsed, by reason of the fact that at this point in time the corresponding charging and/or discharging procedure of the capacitive portion of the circuit part is substantially completed.

In a further advantageous embodiment of the method in accordance with the disclosure, the pulsed useful signal is sensed and/or evaluated continuously, at predeterminable points in time and/or in a periodic manner.

An exemplary embodiment of the disclosure is illustrated in the drawings and is further explained in the description hereinunder. Like reference numerals in the figures describe components or elements that perform like or similar functions.

DETAILED DESCRIPTION

Figure 1:
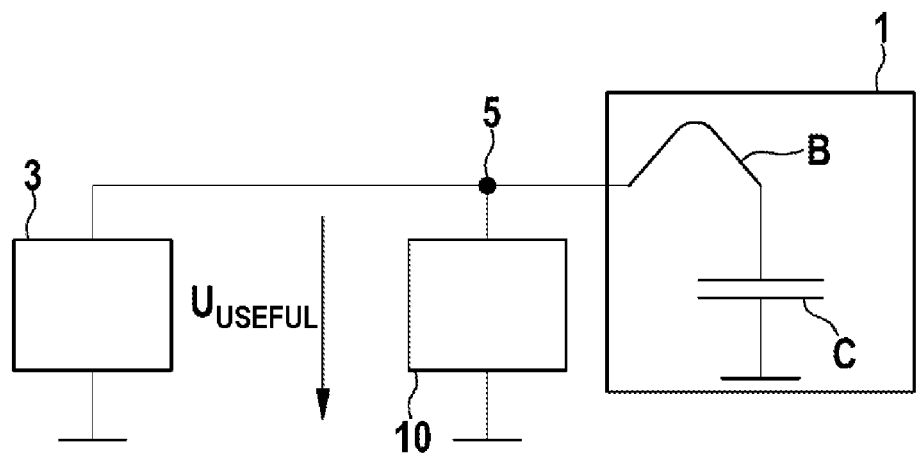
FIG. 1 illustrates a schematic block diagram of an exemplary embodiment of an arrangement in accordance with the disclosure for detecting connection loss at a circuit part having a capacitive behavior with an intact electrical connection.
Figure 2:
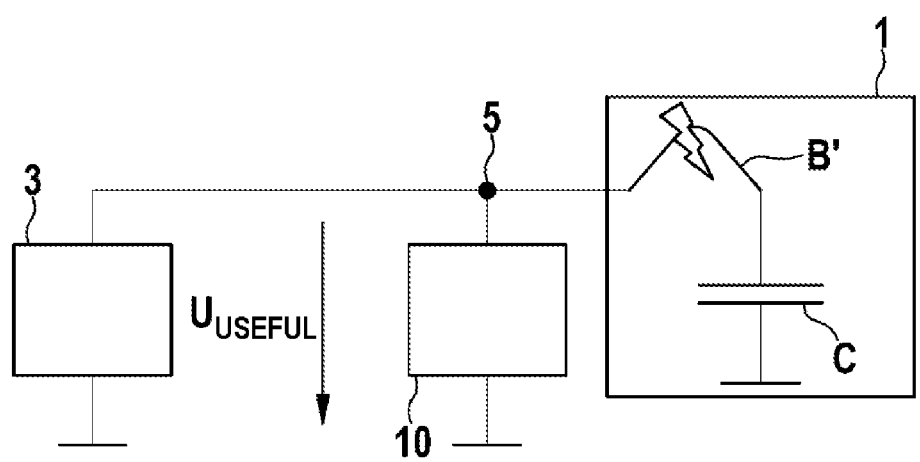
FIG. 2 illustrates a schematic block diagram of the exemplary embodiment of an arrangement in accordance with the disclosure for detecting connection loss at a circuit part having a capacitive behavior with an interrupted and/or disconnected electrical connection.

As is evident from FIGS. 1 and 2, the illustrated exemplary embodiment of an arrangement for detecting connection loss at a circuit part 1 having a capacitive behavior comprises in accordance with the disclosure an evaluating circuit 10, which circuit part is electrically connected to a useful signal source 3. The evaluating circuit 10 is electrically connected to an input junction 5 of the circuit part 1 having a capacitive behavior and said evaluating circuit senses the pulsed useful signal $U_{USEFUL}$ that is output by the useful signal source 3 at the input junction 5 of the circuit part 1 having a capacitive behavior. Furthermore, the evaluating circuit 10 evaluates the signal characteristic for the purpose of detecting connection loss.

As is further evident from FIGS. 1 and 2, the capacitive behavior of the circuit part 1 is represented by a capacitor C and the electrical connection between the input junction 5 and the capacitor is represented by a wire bond B. The difference between the illustrations shown in FIGS. 1 and 2 resides in the fact that the illustration in accordance with FIG. 1 shows the electrical circuit part 1 with an intact electrical connection B, and the illustration in accordance with FIG. 2 shows the electrical circuit part 1 with an interrupted and/or disconnected electrical connection B'.

Figure 3:
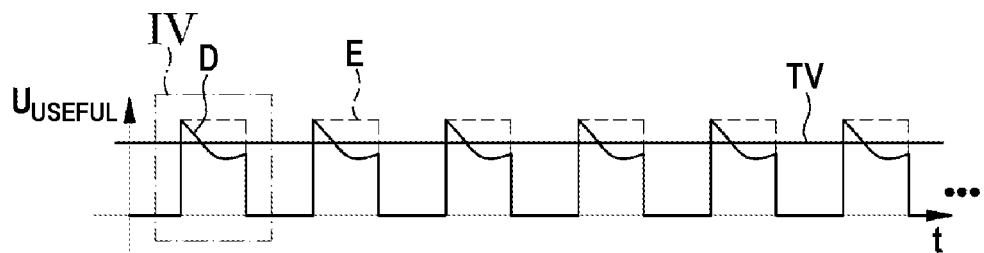
FIG. 3 illustrates a common schematic illustration of the graph of the useful signal at the input junction of the circuit part having a capacitive behavior in the case of an intact electrical connection and the graph of the useful signal at the input junction of the circuit part having a capacitive behavior with an interrupted and/or disconnected electrical connection, and a constant threshold value is also illustrated.
Figure 4:
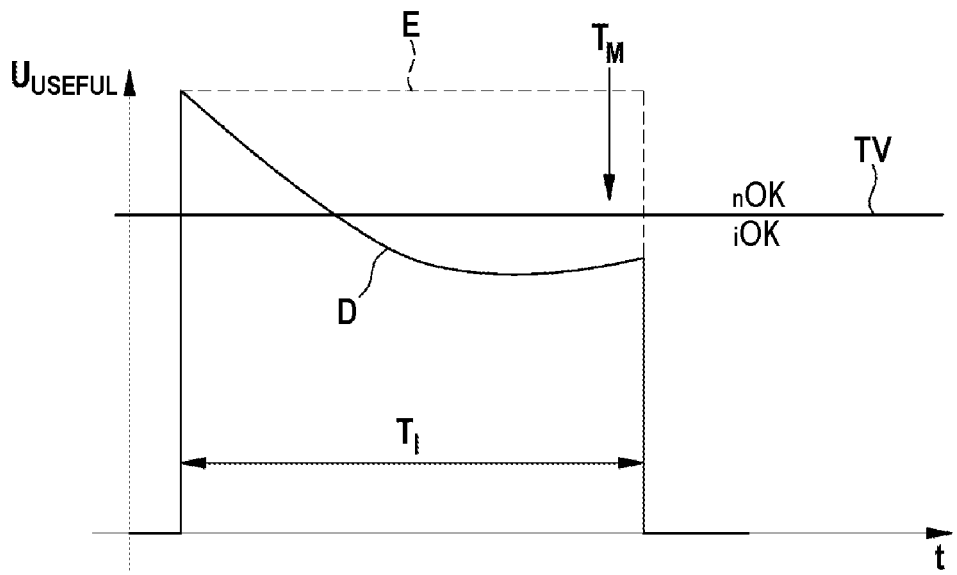
FIG. 4 illustrates a detailed view taken from FIG. 3.

FIG. 3 illustrates a common schematic illustration of the graph of the useful signal $U_{USEFUL}$ at the input junction 5 of the circuit part 1 having a capacitive behavior with an intact electrical connection B and the graph of the useful signal $U_{USEFUL}$ at the input junction 5 of the circuit part 1 having a capacitive behavior where the electrical connection B' is interrupted and/or disconnected, and the figure also shows a constant threshold value TV. FIG. 4 illustrates a pulse of the useful signal $U_{USEFUL}$ as a detailed view taken from FIG. 3.

As is evident from FIGS. 3 and 4, the evaluating circuit 10 evaluates as a signal characteristic a discharge curve D of the pulsed useful signal $U_{USEFUL}$, wherein the progression D of the useful signal $U_{USEFUL}$ represents an intact electrical connection B. The capacitive behavior of the circuit part 1 follows a periodic pattern of charging and discharging. As a consequence, the discharge curve of the useful signal $U_{USEFUL}$ changes in the case of a disconnected and/or interrupted electrical connection B' and this causes an error curve E, illustrated by the broken line.

The evaluating circuit 10 recognizes a disconnected electrical connection B' if a sensed voltage value of the pulsed useful signal $U_{USEFUL}$, which in this case is represented by the broken-line graph of the error signal E, at a measuring point in time $T_M$ exceeds the predetermined threshold value TV. The evaluating circuit 10 then emits as a test result a signal that represents that the connection is not intact (nOK), for example by setting an error bit.

In contrast thereto, the evaluating circuit 10 recognizes an intact electrical connection B if a sensed voltage value of the pulsed useful signal $U_{USEFUL}$, which in this case represents the progression of the discharge curve D, at a measuring point in time $T_M$ is below the predetermined threshold value TV. The evaluating circuit 10 then emits as a test result a signal that represents that the connection is intact (iOK).

As is evident in FIG. 4, the evaluating circuit 10 selects the measuring point in time $T_M$ so that approx. 80 to 95%, preferably 90% of a pulse duration $T_1$ of a corresponding evaluating pulse of the useful signal $U_{USEFUL}$ has elapsed, by reason of the fact that at this point in time the corresponding charging and/or discharging procedure of the capacitive portion C of the circuit part 1 is substantially completed.

The evaluating circuit 10 can sense and/or evaluate the pulsed useful signal $U_{USEFUL}$ for example continuously, at predeterminable points in time and/or in a periodic manner.

Embodiments of the method in accordance with the disclosure for detecting connection loss at a circuit part 1 having a capacitive behavior, which circuit part is electrically connected to a useful signal source 3, sense in accordance with the disclosure at the input junction 5 of the circuit part 1 having a capacitive behavior the useful signal $U_{USEFUL}$ that is output by the useful signal source 3 and evaluate the signal characteristic for detecting connection loss. It is preferred that a discharge curve D of the pulsed useful signal $U_{USEFUL}$ is evaluated as a signal characteristic, wherein a disconnected connection is recognized if a sensed voltage value of the pulsed useful signal $U_{USEFUL}$ at the measuring point in time $T_M$ exceeds the predetermined threshold value TV, and wherein an intact connection is recognized if the sensed voltage value of the pulsed useful signal $U_{USEFUL}$ at a measuring point in time $T_M$ is below the predetermined threshold value TV. The measuring point in time $T_M$ is preferably selected so that the charging and/or discharging procedure of the capacitive portion C of the circuit part 1 is substantially completed. This means that the measuring point in time $T_M$ is set at a point in time at which approx. 80 to 95%, preferably 90% of the pulse duration $T_1$ of a corresponding evaluating pulse of the useful signal $U_{USEFUL}$ has elapsed.

The pulsed useful signal $U_{USEFUL}$ can be sensed for example continuously, at predeterminable points in time and/or in a periodic manner, and/or the pulsed useful signal $U_{USEFUL}$ can be evaluated continuously, at predeterminable points in time and/or in a periodic manner for detecting connection loss.

Embodiments of the present disclosure provide an arrangement for detecting connection loss at a circuit part having a capacitive behavior, which arrangement in an advantageous manner renders it possible to monitor a connection with little expenditure on the hardware and without having to provide additional signal generators for generating test signals and said arrangement consequently provides a solution to achieve a safe and reliable operation.

The invention claimed is:

1. An arrangement for detecting connection loss at a circuit part having a capacitive behavior, the circuit part being electrically connected to a signal source configured to drive the circuit part for at least one purpose in addition to detecting connection loss, comprising:
   an evaluating circuit that is electrically connected to an input junction of the circuit part, the evaluating circuit configured (i) to sense a pulsed signal that is output by the signal source at the input junction of the circuit part, (ii) to detect an electrical connection loss between the circuit part and the signal source in response to a sensed voltage value of the pulsed signal at a measuring point in time exceeding a predetermined threshold value, the measuring point in time being within a pulse of the pulsed signal, and (iii) detect an intact electrical connection between the circuit part and the signal source in response to the sensed voltage value of the pulsed signal at the measuring point in time being below the predetermined threshold value.

2. The arrangement as claimed in claim 1, wherein the evaluating circuit is further configured to select the measuring point in time so that approximately 80 to 95% of a pulse duration of the pulse of the pulsed signal has elapsed.

3. The arrangement as claimed in claim 1, wherein the evaluating circuit is further configured to sense the pulsed signal at least one of (i) continuously, (ii) at predeterminable points in time, and (iii) in a periodic manner.

4. The arrangement as claimed in claim 1, wherein the pulsed signal is a periodic signal.

5. A method for detecting connection loss at a circuit part having a capacitive behavior, the circuit part being electrically connected to a signal source configured to drive the circuit part for at least one purpose in addition to detecting connection loss, comprising:
   sensing a pulsed signal that is output by the signal source at an input junction of the circuit part;
   detecting an electrical connection loss between the circuit part and the signal source in response to a sensed voltage value of the pulsed signal at a measuring point in time exceeding a predetermined threshold value, the measuring point in time being within a pulse of the pulsed signal; and
   detecting an intact electrical connection between the circuit part and the signal source in response to the sensed voltage value of the pulsed signal at the measuring point in time falling below the predetermined threshold value.

6. The method as claimed in claim 5, wherein the measuring point in time is selected so that approximately 80 to 95% of a pulse duration of the pulse of the pulsed signal has elapsed.

7. The method as claimed in claim 5, wherein the pulsed signal is sensed at least one of (i) continuously, (ii) at predeterminable points in time, and (iii) in a periodic manner.

8. The method as claimed in claim 5, wherein the pulsed signal is a periodic signal.

* * * * *